United States Patent
Gates

[19]

[11] Patent Number: 5,874,704
[45] Date of Patent: Feb. 23, 1999

[54] LOW INDUCTANCE LARGE AREA COIL FOR AN INDUCTIVELY COUPLED PLASMA SOURCE

[75] Inventor: Duane Charles Gates, Danville, Calif.

[73] Assignee: Lam Research Corporation, Fremont, Calif.

[21] Appl. No.: 491,342

[22] Filed: Jun. 30, 1995

[51] Int. Cl.[6] .................................................. B23K 10/00
[52] U.S. Cl. ............................. 219/121.43; 219/121.57; 219/121.41; 156/345; 118/723 I; 204/298.08
[58] Field of Search .................... 219/121.41, 121.44, 219/121.43, 121.57; 315/111.21, 111.41, 111.51; 156/345, 643, 646; 204/298.19, 298.37, 298.38, 298.34, 298.08; 118/723 I

[56] References Cited

U.S. PATENT DOCUMENTS

| | | |
|---|---|---|
| 4,340,462 | 7/1982 | Koch . |
| 4,612,077 | 9/1986 | Tracy et al. . |
| 4,617,079 | 10/1986 | Tracy et al. . |
| 4,948,458 | 8/1990 | Ogle ........................................ 156/643 |
| 5,198,718 | 3/1993 | Davis et al. . |
| 5,234,529 | 8/1993 | Johnson ................................. 156/345 |
| 5,241,245 | 8/1993 | Barnes et al. ...................... 315/111.41 |
| 5,304,279 | 4/1994 | Coultas et al. . |
| 5,368,710 | 11/1994 | Chen et al. . |
| 5,401,350 | 3/1995 | Patrick et al. .......................... 156/345 |
| 5,405,480 | 4/1995 | Benzing et al. . |

FOREIGN PATENT DOCUMENTS

| | | |
|---|---|---|
| 0596551 | 5/1994 | European Pat. Off. . |
| 0694949 | 1/1996 | European Pat. Off. . |
| 0710055 | 5/1996 | European Pat. Off. . |
| 8-83695 | 3/1996 | Japan . |
| 8-148476 | 6/1996 | Japan . |

*Primary Examiner*—Mark H. Paschall
*Attorney, Agent, or Firm*—Lowe Hauptman; Gopstein & Berner

[57] ABSTRACT

A low inductance large area coil (LILAC) is provided as a source for generating a large area plasma. The LILAC comprises at least two windings which, when connected to an RF source via impedance matching circuitry, produce a circulating flow of electrons to cause a magnetic field in the plasma. Because the LILAC employs multiple windings, few turns of winding are required to obtain a large area coil, so that the inductance of the LILAC is low. The low inductance of the LILAC ensures that the self-resonating frequency of the LILAC is kept at a level far above the RF driving frequency, allowing a broad frequency range for impedance matching. Thus, there is no difficulty in impedance matching, and power transfer can be maximized, permitting efficient generation of a large area plasma.

22 Claims, 5 Drawing Sheets

LOW INDUCTANCE LARGE AREA COIL FOR AN INDUCTIVELY COUPLED PLASMA SOURCE

BACKGROUND OF THE INVENTION

The present invention relates generally to a low inductance large area coil for an inductively coupled plasma source. More specifically, the present invention relates to a low inductance large area coil as a source for generating a plasma which can be used for treating semiconductor wafers in low pressure processing equipment.

Plasma generation is useful in a variety of semiconductor fabrication processes, for example enhanced etching, deposition, etc. Plasmas are generally produced from a low pressure gas by inducing an electron flow which ionizes individual gas molecules through the transfer of kinetic energy through individual electron-gas molecule collisions. The electrons are commonly accelerated in an electric field, typically a radio frequency (RF) electric field.

Numerous methods have been proposed to accelerate the electrons in the RF electric field. One method is to excite electrons between a pair of opposed electrodes which are oriented parallel to the wafer in a processing chamber. The use of an electric field normal to the wafer does not provide efficient conversion of the kinetic energy to ions, since a large portion of the electron energy is dissipated through electron collisions with the walls of the processing chamber or with the semiconductor wafer itself.

A more efficient technique for exciting electrons in the RF field is to use a single winding coil (SWC) parallel to the plane of the wafer and the plasma to excite the electrons. U.S. Pat. No. 4,948,458 discloses a device, depicted in FIGS. 1–3, employing such a technique. As shown in FIG. 1, a plasma generating device includes an enclosure 10 with an access port 12 formed in an upper wall 14. A dielectric shield 16 is disposed below the upper wall 14 and extends across the access port 12. The dielectric shield 16 is sealed to the wall 14 to define a vacuum-tight interior of the enclosure 10. A planar single winding spiral or spiral like coil (SWC) 20 is disposed within the access port 12 adjacent the dielectric shield 16 and oriented parallel to the wafer W, i.e. workpiece, which is supported by a surface 22, i.e. workpiece holder. A process gas is introduced into the chamber 18 through a port 24 formed on side of the enclosure 10.

FIG. 2 is a schematic diagram of the plasma generating device illustrated in FIG. 1. As shown in FIGS. 1 and 2, an RF source 30 is coupled via a coaxial cable 32 through an impedance matching circuit 35 to the SWC 20 such that the matching circuit has first and second output terminals respectively connected to inner and outer terminals of coil 20. The impedance matching circuit 35 includes a primary coil 36 and a secondary loop 38 which may be positioned to adjust the effective coupling of the circuit and allow for loading of the circuit at the frequency of operation, thereby maximizing power transfer. The primary coil 36 is mounted on a disk 40 which may be rotated about a vertical axis 42 in order to adjust the coupling. A tuning capacitor 44 is provided in series with the secondary loop 38 to adjust the circuit resonant frequency to the RF driving frequency. Another capacitor 34 cancels part of the inductive reactance of the primary coil 36 in the circuit. By resonating an RF current at a resonant frequency tuned to typically 13.56 Mhz through the spiral or spiral like coil 20, a planar magnetic field is induced, which penetrates the dielectric shield 16. The magnetic field causes a circulating flow of electrons between the coil 20 and the wafer W. The circulating flow of electrons makes it less likely that the electrons will strike the enclosure wall 10 between the coil 20 and the wafer W, and since the electrons are confined to a plane parallel to the planar coil 20, the transfer of kinetic energy in non-planar directions is minimized.

Shown in detail in FIG. 3, the SWC 20 comprises a singular conductive element formed into a planar spiral or a series of concentric rings forming a spiral like arrangement as shown in FIG. 6 of the '458 patent. The concentric ring and spiral coil have an inner terminal and an outer terminal connected together by an arcuate conductor having multiple turns that extend radially and circumferentially between the terminals. As shown in FIGS. 1 and 3, the SWC 20 also includes a center tap or terminal labeled (+) and an outer tap or terminal labeled (−), coil 20 respectively matching network first and second output terminals.

In certain applications, such as the production of 400 mm wafers or large area flat panel displays, a large area plasma is needed. In order to produce a large area plasma, the area or diameter of the SWC 20 shown in FIGS. 1–3 must be increased. For a fixed pitch between turns, the SWC 20 increases in inductance if turns are added to increase the diameter. At large diameters, the SWC 20 has a high inductance, which reduces the self-resonating frequency of the SWC 20. As the self-resonating frequency becomes nearer the radio frequency (RF) driving frequency, which is normally 13.56 MHz, impedance matching becomes more and more difficult. This is because it is difficult to exactly match impedance within a small frequency range, due to the increased sensitivity of the match condition to changes in the settings of the impedance matching components. Therefore, a difficulty arises in maximizing power transfer when using an SWC to generate a larger area plasma.

SUMMARY OF THE INVENTION

In accordance with one aspect of the invention a vacuum plasma processor comprises a vacuum plasma processing chamber arranged to be responsive to a source of ionizable gas and including a workpiece holder wherein a coil including plural windings responsive to an r.f. source excites the gas to a plasma capable of processing workpieces on the holder. Each of the windings includes inner and outer terminals and plural turns extending radially and circumferentially between the inner and outer terminals. The r.f. source includes a matching network having first and second output terminals such that the first and second output terminals are respectively connected to the inner terminals. The connections between the matching network first and second output terminals and the inner and outer terminals of the plural windings are such that current flowing through the matching network output terminals drives the plural windings in parallel.

Another aspect of the invention relates to an excitation source having a coil for use in a vacuum processing chamber responsive to a source of ionizable gas and including a workpiece holder wherein the source includes a coil having plural windings responsive to an r.f. source including a matching network having first and second output terminals. The coil responds to current from the source to excite the gas to a plasma capable of processing workpieces on the holder. Each of the windings includes inner and outer terminals and plural turns extending radially and circumferentially between the inner and outer terminals. The matching network first and second output terminals are respectively connected to the inner and outer terminals. The connections between the matching network first and second output terminals and the inner and outer terminals of the plural windings are such that current flowing through the matching network output terminals drives the plural windings in parallel.

A further aspect of the invention concerns a plasma processing apparatus comprising a vacuum vessel; a substrate holder; a discharge coil which is partially or wholly made to have a multiple spiral configuration; a high frequency power source; and a matching circuit connected to (a) the discharge coil by way of a conductor wire and (b) the high frequency power source via a connection cable to cause plasma to be generated inside the vacuum vessel by applying a high frequency voltage to the discharge coil to process a substrate disposed on the substrate holder.

An added aspect of the invention relates to a plasma reactor for processing a semiconductor wafer, comprising: a vacuum chamber; means for introducing a processing gas into said vacuum chamber; a wafer pedestal for supporting said semiconductor wafer inside said vacuum chamber; an RF power source; and a coil antenna reactively coupled with the vacuum chamber for exciting processing gas introduced into the chamber into a plasma. The coil antenna comprises plural concentric spiral conductive windings wherein each of the windings has an interior end near an apex of a spiral of the winding and an outer end at a periphery of the spiral of the winding, and a common terminal connected to the interior ends of said plural concentric spiral windings. The RF power source is connected across the terminal and the outer end of each one of said windings.

Still a further aspect of the invention relates to a coil antenna for radiating RF power supplied by an RF source into a vacuum chamber of an inductively coupled plasma reactor which processes a semiconductor wafer in said vacuum chamber. The reactor has a gas supply inlet for supplying processing gases into said vacuum chamber. The coil antenna comprises (a) plural concentric spiral conductive windings, each having an interior end near an apex of a spiral of the winding and an outer end at a periphery of the spiral of the winding, and (b) a common terminal connected to the interior ends of the plural concentric spiral windings. The RF power source is connected across the terminal and the outer end of each one of the windings.

According to various aspects of the invention, the coil can have different configurations. For instance, the windings can be parallel and in the same plane, the coil can be non-planar, the windings can be connected together at opposite ends thereof, the windings can be unconnected together at opposite ends thereof, the windings can be interleaved, the windings can be non-interleaved but cover different surface areas and/or the turns of one of the windings are separated by the turns of the other one of the windings. The enclosure can comprise a multiple or single wafer etching apparatus wherein a wafer chuck supports one or more semiconductor wafers having a surface to be processed parallel to the plane of the coil.

The invention also provides a method for generating an inductively coupled plasma, the method comprising the steps of introducing a process gas into a plasma reaction chamber enclosed by an enclosure bounded by a dielectric shield, and resonating a radio frequency current in a coil comprising at least two electrically conductive windings disposed outside the enclosure proximate the dielectric shield, the radio frequency current being effective to excite the process gas into a plasma within the chamber.

The method can be carried out using the various coil configurations mentioned above. Further, the plasma can be used to process one or more substrates such as semiconductor wafers or flat panel displays. For instance, a semiconductor wafer can be located in the chamber and a layer on the wafer can be etched by the plasma. During processing, the chamber can be maintained at a wide range of pressures but in a preferred embodiment the pressure is maintained below 100 mTorr.

DETAILED DESCRIPTION OF THE PREFERRED EMBODIMENTS

The present invention provides a low inductance large area coil (LILAC) with multiple spiral or spiral like windings which, when connected to an RF source, efficiently generates a large area plasma. Since the LILAC has multiple windings, fewer turns of winding are required to obtain a large diameter than if only one winding were used, as in a single-winding coil. Fewer turns of winding creates less inductance, which keeps the self-resonating frequency of the LILAC high, well above the normal 13.56 MHz RF driving frequency. The broad frequency range between the self-resonating frequency of the LILAC and the RF driving frequency enables accurate impedance matching, ensuring a maximum power transfer and an efficient generation of plasma.

According to the present invention, a low inductance large area coil (LILAC) is provided as a source for generating a large area plasma. The LILAC comprises at least two spiral or spiral like windings (i.e. windings having inner and outer terminals and which traverse an arcuate path extending circumferentially and radially between these terminals) which, when connected to an RF source via impedance matching circuitry, produce a circulating flow of electrons to cause a magnetic field in the plasma. Because the LILAC employs multiple windings, few turns of winding are required to obtain a large area coil, so that the inductance of the LILAC is low relative to the inductance of the prior art coils of FIGS. 1–3 and 4a. The low inductance of the LILAC ensures that the self-resonating frequency of the LILAC is far above the RF driving frequency, allowing a broad frequency range for impedance matching. Thus, there is no difficulty in impedance matching, and power transfer can be maximized, permitting efficient generation of a large area plasma.

Figure 4A:
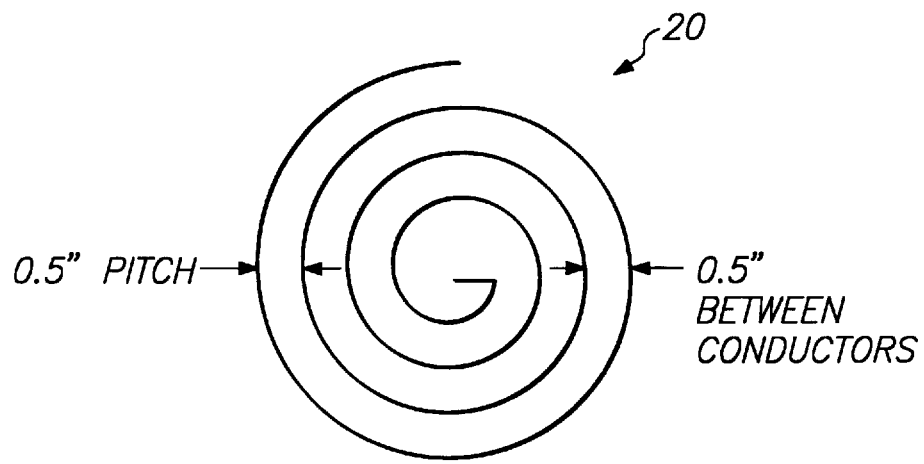
FIGS. 4A and 4B are top views of a conventional single winding spiral coil and a double winding spiral coil according to the present invention.
Figure 4B:
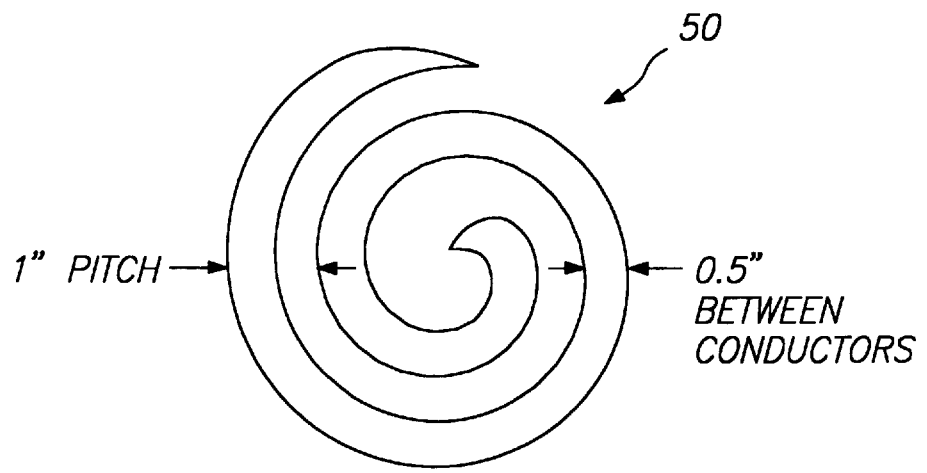

FIGS. 4A and 4B are top views of an SWC and a LILAC with the same diameter, to provide a comparison of these coils. In FIG. 4A, the SWC 20 has a single winding consisting of four turns with a pitch of 0.5 inches between conductors forming the four turns. The LILAC 50 in FIG. 4B has the same diameter and same interconductor spacing as the SWC 20 in FIG. 4A, but has two windings, each including two turns that extend radially and circumferentially between inner and outer terminals of the winding. The turns of one winding are spaced from each by a pitch of 1 inch. The inner ends of the two windings of coil 50 are connected to each other and to the first output terminal of the prior art matching network 35, while the outer ends of the two windings of coil 50 are connected to each other and to the second output terminal of the prior art matching network 35. Since the LILAC 50 has the same diameter and half as many turns as the SWC 20, the inductance of the LILAC is lower, which makes impedance matching easier at large diameters. The LILAC inductance is also lower than that of the SWC because some or all of the windings are electrically connected in parallel and plural inductors connected in parallel have a lower net inductive impedance than a single individual inductor having the same geometry.

Figure 5:
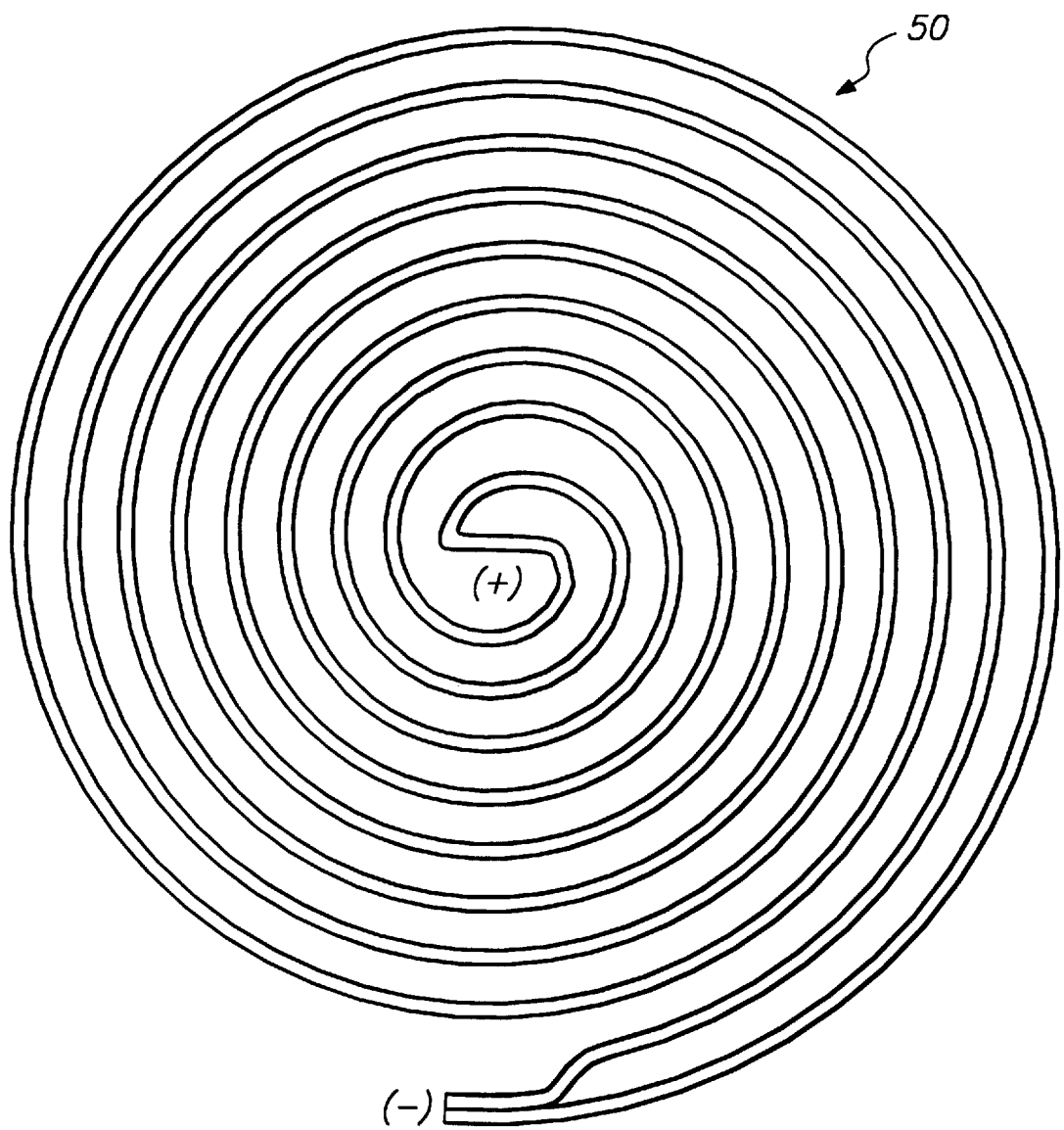
FIG. 5 is a top view of an interleaved double winding spiral coil according to another embodiment of the present invention.

A simple double winding version of the LILAC is illustrated in FIG. 5. Referring to FIG. 5, the double winding LILAC 50 has a planar spiral geometry, with two windings electrically connected in parallel with each other. The pitch is doubled, relative to an SWC of the same diameter, with the windings interleaved to give a coil with about the same spacing between conductors as the SWC. The two windings are connected together at each end. A center tap or terminal (+) and an outer tap (−) facilitate connection of the two windings in parallel to opposite first and second output terminals of matching network 35 of a plasma generating device.

Although in FIG. 5, the ends of the two windings are shown as being connected, the ends of the windings do not have to be connected. One or more of the windings can be shorter than another winding and connected to that winding at some other point than the end. Alternatively, more than two interleaved windings may be used or the coil may be non-planar.

Figure 6:
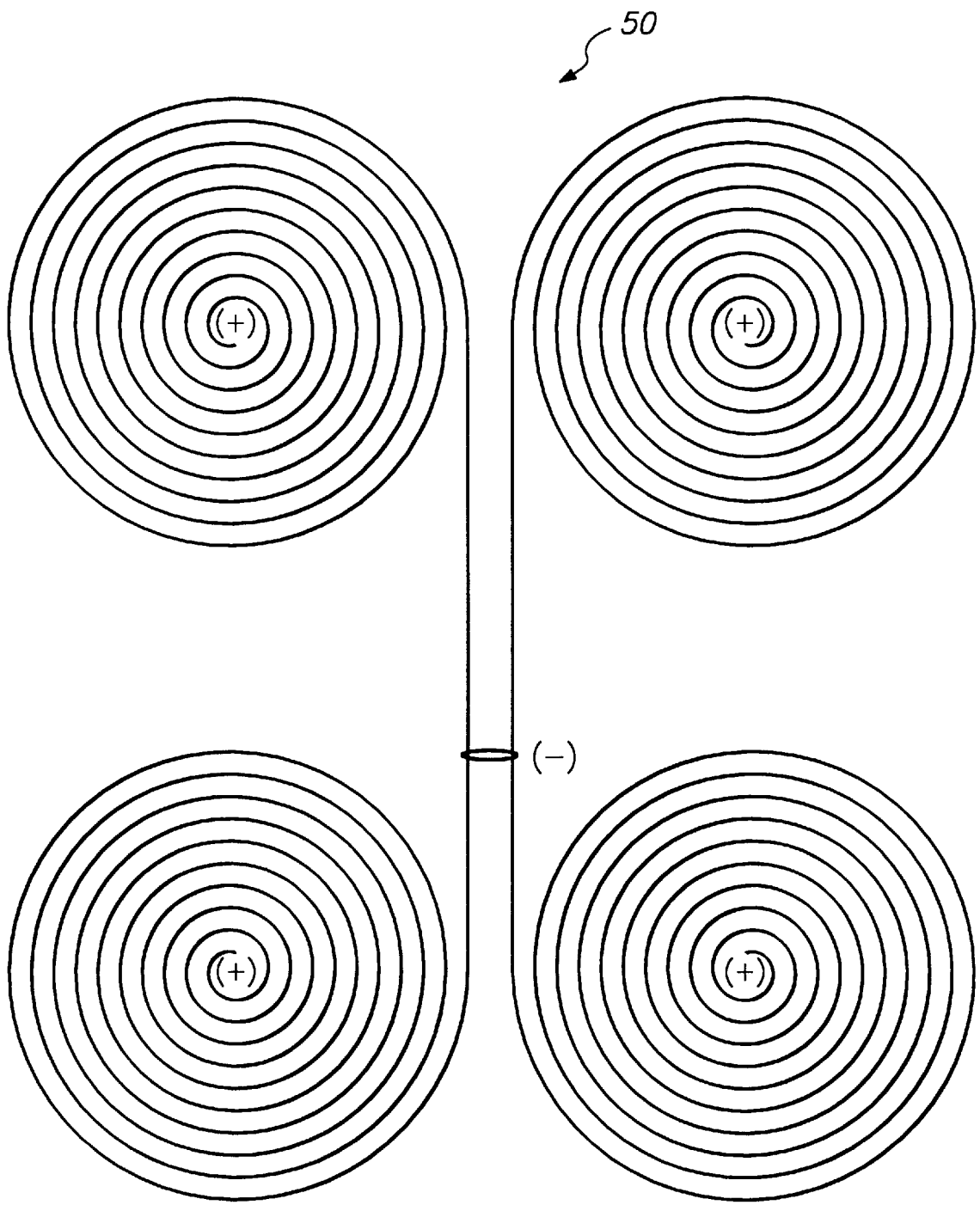
FIG. 6 is a top view of another embodiment of the present invention having four spatially displaced spirals.

FIG. 6 is a top view of another embodiment of a LILAC, including four non-interleaved spiral windings. Each of the windings has a (+) tap or terminal in its respective center and a (−) outer tap or terminal. The negative outer taps are connected together and to the first output terminal of matching network 35. The (+) interior taps are connected to the second output terminal of matching network 35, whereby the four spiral windings are electrically connected in parallel with each other. The four parallel windings cover different surface areas, similar to several SWCs in parallel. A LILAC using non-interleaved multiple windings to cover an area requires fewer turns than an SWC covering the same area. Thus, the non-interleaved LILAC configuration has a lower inductance and ensures an efficient large area plasma generation.

Figure 1:
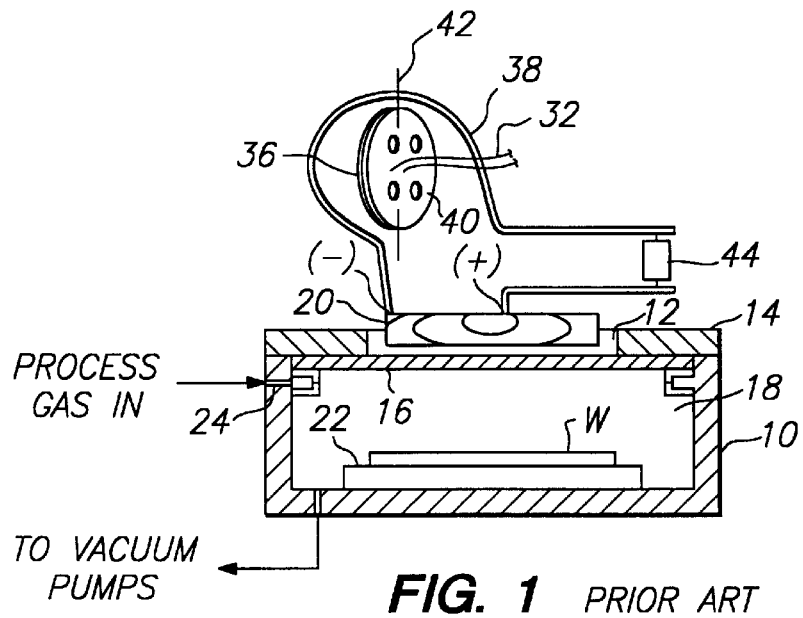
FIG. 1 is a schematic diagram of plasma generating device employing a conventional single winding coil.
Figure 2:
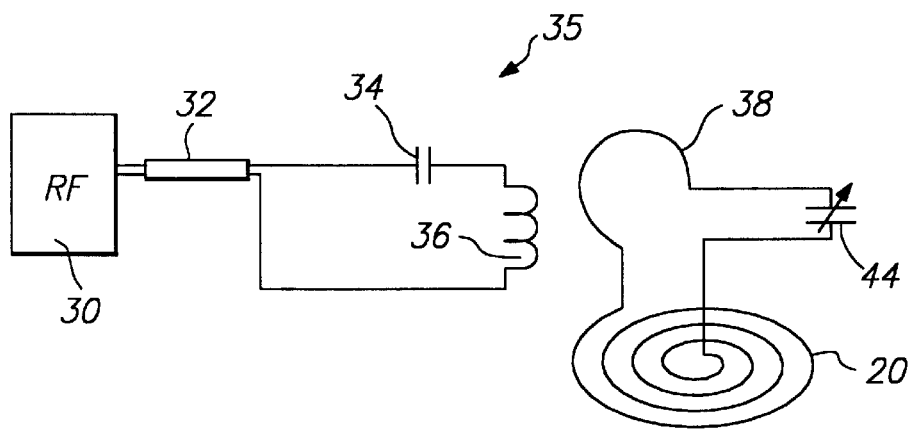
FIG. 2 is a schematic illustration of a prior art plasma generating device employing a conventional single winding coil.
Figure 3:
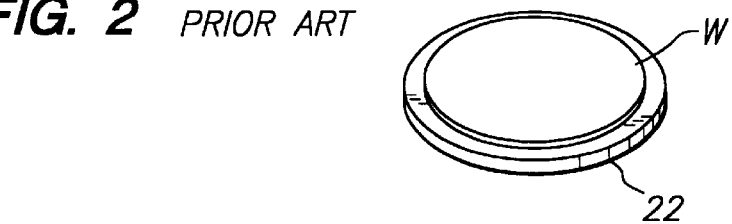
FIG. 3 is in detailed perspective view of a conventional single winding coil.
Figure 7:
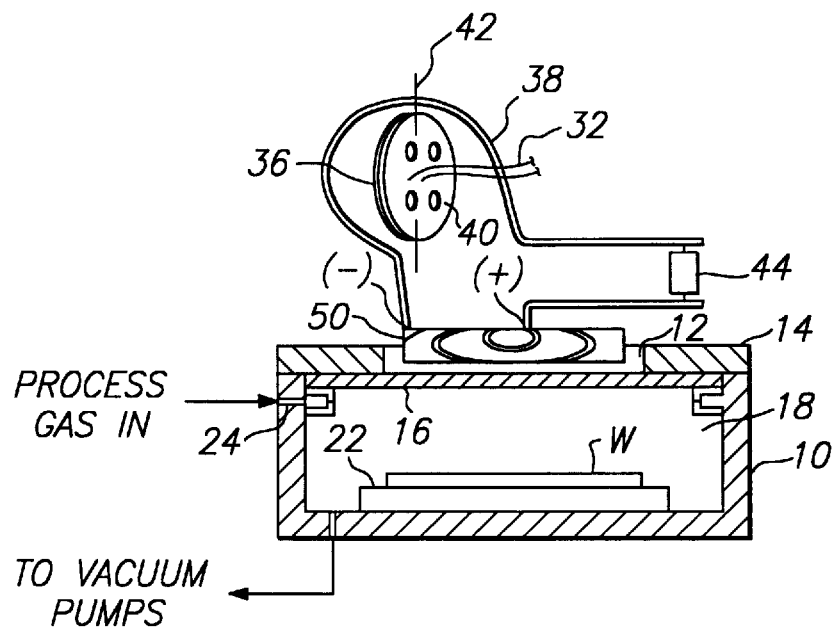
FIG. 7 is a schematic diagram of a plasma generating device employing a low inductance large area coil according to the present invention.
Figure 8:
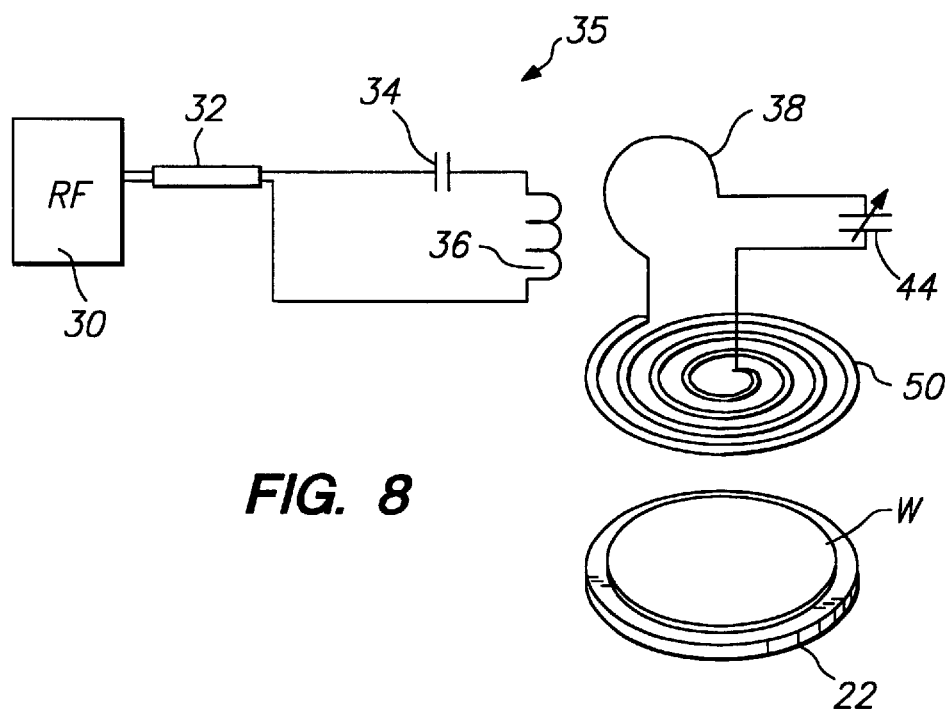
FIG. 8 is a schematic diagram of a plasma generating device employing a low inductance large area coil according to the present invention.

A plasma generating device employing the LILAC is depicted in FIGS. 7 and 8. The LILAC 50 may be simply powered by a single RF source 30 and an impedance matching circuit 35, like those used to power the SWC 20 as shown in FIGS. 1 and 2. Alternatively, although not illustrated, a complex LILAC design with multiple windings can employ multiple matching networks and generators.

The LILAC 50 described above permits efficient generation of a large area plasma. Although particular embodiments of the invention have been described, it will be appreciated by those of ordinary skill in the art that the present invention can be embodied in other specific forms without departing from the spirit or essential characteristics thereof. For example, although a LILAC with two or four windings has been illustrated, the number of windings is not limited thereto, but may be any number which meets the demands of large area plasma generation. Also, although the LILAC has been described as the primary coil for plasma generation, it can also be used as an auxiliary coil in conjunction with a different primary coil. The presently disclosed embodiments are therefore considered in all respects to be illustrative, and not restrictive. The scope of the invention is indicated by the appended claims, rather than the foregoing description, and all changes that come within the meaning and range of equivalence thereof are intended to be embraced therein.

What is claimed is:

1. A vacuum plasma processor comprising a vacuum plasma processing chamber arranged to be responsive to a source of ionizable gas and including a workpiece holder, a coil responsive to an r.f. source for exciting the gas to a plasma capable of processing workpieces on the holder, the coil including plural windings, each of the windings including inner and outer terminals and plural turns extending radially and circumferentially between the inner and outer terminals, the r.f. source including a matching network having first and second output terminals, the matching network first output terminal being connected to the inner terminals, the matching network second output terminal being connected to the outer terminals, the connections between the matching network first and second output terminals and the inner and outer terminals of the plural windings being such that current flowing through the matching network output terminals drives the plural windings in parallel, each of the windings including plural interleaved turns arranged so the windings are interleaved.

2. The vacuum plasma processor of claim 1 wherein the inner terminals of the plural windings have a common connection at a single location in the coil.

3. The vacuum plasma processor of claim 2 wherein pairs of the plural windings have segments extending radially in opposite directions away from the single location.

4. The vacuum plasma processor of claim 2 wherein the outer terminals of the plural windings have a common connection at a single location in the coil.

5. The vacuum plasma processor of claim 2 wherein each of the windings comprises a spiral like configuration.

6. A vacuum plasma processor comprising a vacuum plasma processing chamber arranged to be responsive to a source of ionizable gas and including a workpiece holder, a coil responsive to an r.f. source for exciting the gas to a plasma capable of processing workpieces on the holder, the coil including plural windings, each of the windings including inner and outer terminals and plural turns extending radially and circumferentially between the inner and outer terminals, the r.f. source including a matching network having first and second output terminals, the matching network first output terminal being connected to the inner terminals, the matching network second output terminal being connected to the outer terminals, the connections between the matching network first and second output terminals and the inner and outer terminals of the plural windings being such that current flowing through the matching network output terminals drives the plural windings in parallel, the inner terminals of the plural windings having a common connection at a single location in the coil.

7. The vacuum plasma processor of claim 6 wherein pairs of the plural windings have segments extending radially in opposite directions away from the single location.

8. The vacuum plasma processor of claim 7 wherein the segments comprise straight lines.

9. An excitation source for use in a vacuum processing chamber responsive to a source of ionizable gas and including a workpiece holder, the source comprising a coil having plural windings connected to be responsive to an r.f. source including a matching network having first and second output terminals, the coil being connected so it is adapted to respond to current from the source to excite the gas to a plasma capable of processing workpieces on the holder, each of the windings including inner and outer terminals and plural turns extending radially and circumferentially between the inner and outer terminals, the matching network first output terminal being connected to the inner terminals, the matching network second output terminal being connected to the outer terminals, the connections between the matching network first and second output terminals and the inner and outer terminals of the plural windings being such that current flowing through the matching network output terminals drives the plural windings in parallel, each of the windings including plural interleaved turns arranged so the windings are interleaved.

10. The coil of claim 9 wherein the inner terminals of the plural windings have a common connection at a single location in the coil.

11. The coil of claim 10 wherein pairs of the plural windings have segments extending radially in opposite directions away from the single location.

12. The coil of claim 10 wherein the outer terminals of the plural windings have a common connection at a single location in the coil.

13. The coil of claim 10 wherein each of the windings comprises a spiral like configuration.

14. An excitation source for use in a vacuum processing chamber responsive to a source of ionizable gas and including a workpiece holder, the source comprising a coil having plural windings connected to be responsive to an r.f. source including a matching network having first and second output terminals, the coil being connected so it is adapted to respond to current from the source to excite the gas to a plasma capable of processing workpieces on the holder, each of the windings including inner and outer terminals and plural turns extending radially and circumferentially between the inner and outer terminals, the matching network first output terminal being connected to the inner terminals, the matching network second output terminal being connected to the outer terminals, the connections between the matching network first and second output terminals and the inner and outer terminals of the plural windings being such that current flowing through the matching network output terminals drives the plural windings in parallel, the outer terminals of the plural windings having different locations in the coil, a separate lead connecting the outer terminal of each of the plural windings at the different coil locations to the matching network second output terminal.

15. An excitation source for use in a vacuum processing chamber responsive to a source of ionizable gas and including a workpiece holder, the source comprising a coil having plural windings connected to be responsive to an r.f. source including a matching network having first and second output terminals, the coil being connected so it is adapted to respond to current from the source to excite the gas to a plasma capable of processing workpieces on the holder, each of the windings including inner and outer terminals and plural turns extending radially and circumferentially between the inner and outer terminals, the matching network first output terminal being connected to the inner terminals, the matching network second output terminal being connected to the outer terminals, the connections between the matching network first and second output terminals and the inner and outer terminals of the plural windings being such that current flowing through the matching network output terminals drives the plural windings in parallel, the inner terminals of the plural windings having a common connection at a single location in the coil.

16. A plasma reactor for processing a semiconductor wafer, comprising:

a vacuum chamber;

means for introducing a processing gas into said vacuum chamber;

a wafer pedestal for supporting said semiconductor wafer inside said vacuum chamber;

an RF power source;

a coil antenna reactively coupled with processing gas in said vacuum chamber for exciting the processing gas introduced into the chamber into a plasma, said coil antenna comprising:

plural concentric spiral conductive windings, each of said windings having an interior end near an apex of a spiral of the winding and an outer end at a periphery of the spiral of the winding, and a common terminal connected to the interior ends of said plural concentric spiral windings, said RF power source being connected across said terminal and the outer end of each one of said windings.

17. The plasma reactor of claim 16 wherein said reactor chamber comprises a planar ceiling and said antenna coil has a planar disk shape and lies on an exterior surface of said ceiling.

18. The plasma reactor of claim 16 wherein said plural windings are of about the same length.

19. The plasma reactor of claim 18 wherein said coil antenna comprises three of said windings.

20. The plasma reactor of claim 16 wherein said inner ends of said windings are radially spaced from said apex and connected to said common terminal by respective straight line symmetrically spaced conductors.

21. A coil antenna for radiating RF power supplied by an RF source into a vacuum chamber of an inductively coupled plasma reactor which processes a semiconductor wafer in said vacuum chamber, said reactor having a gas supply inlet for supplying processing gases into said vacuum chamber, said coil antenna comprising:

plural concentric spiral conductive windings, each of said windings having an interior end near an apex of a spiral of the winding and an outer end at a periphery of the spiral of the winding, and a common terminal connected to the interior ends of said plural concentric spiral windings, said RF power source being connected across said terminal and the outer end of each one of said windings.

22. The coil antenna of claim 21 wherein said plural windings are of about the same length.

* * * * *